United States Patent
D'Angelo (10) Patent No.: US 11,204,620 B2
(45) Date of Patent: Dec. 21, 2021

(54) HIGH RESOLUTION TIME CAPTURE CIRCUIT AND CORRESPONDING DEVICE, CAPTURE METHOD AND COMPUTER PROGRAM PRODUCT

(71) Applicant: STMicroelectronics S.r.l., Agrate Brianza (IT)

(72) Inventor: Giuseppe D'Angelo, Tufino (IT)

(73) Assignee: STMICROELECTRONICS S.R.L., Agrate Brianza (IT)

(*) Notice: Subject to any disclaimer, the term of this patent is extended or adjusted under 35 U.S.C. 154(b) by 0 days.

(21) Appl. No.: 16/851,988

(22) Filed: Apr. 17, 2020

(65) Prior Publication Data
US 2020/0341505 A1  Oct. 29, 2020

(30) Foreign Application Priority Data
Apr. 26, 2019 (IT) .................. 102019000006396

(51) Int. Cl.
| | | |
|---|---|---|
| H03K 21/00 | (2006.01) | |
| G06F 1/08 | (2006.01) | |
| G04F 10/04 | (2006.01) | |
| H03K 5/159 | (2006.01) | |
| H03K 21/02 | (2006.01) | |

(52) U.S. Cl.
CPC ............. *G06F 1/08* (2013.01); *G04F 10/04* (2013.01); *H03K 5/159* (2013.01); *H03K 21/02* (2013.01)

(58) Field of Classification Search
None
See application file for complete search history.

(56) References Cited

U.S. PATENT DOCUMENTS

| | | | | |
|---|---|---|---|---|
| 6,826,247 B1* | 11/2004 | Elliott | ................... | G09G 5/008 327/150 |
| 8,970,276 B1* | 3/2015 | McShea | ................. | H03K 5/135 327/269 |
| 2006/0269030 A1* | 11/2006 | Eckhardt | ................... | H03L 7/08 375/371 |
| 2010/0141240 A1 | 6/2010 | Hutchinson | | |

(Continued)

FOREIGN PATENT DOCUMENTS

EP     0300757 A2     7/1988

OTHER PUBLICATIONS

Texas Instruments Incorporated, "TMS320x2803x Piccolo High Resolution Capture (HRCAP)", Reference Guide, Literature No. SPRUH56, Jan. 2012, 29 pages.

*Primary Examiner* — Tuan T Lam
(74) *Attorney, Agent, or Firm* — Slater Matsil, LLP (57) ABSTRACT

A time capture circuit can measure time between edges of a logic input signal. A delay line generates consecutive increasingly delayed replicas of the logic input signal. A free running counter is clocked by a counter clock signal corresponding to an external clock signal multiplied by a clock scale factor. A counter value capture circuit captures the counter value upon occurrence of an edge in the input signal, outputs a captured counter value, and issues a trigger signal. A decoder determines a decoded value based on values of the input signal and of the plurality of consecutive increasingly replicas when the trigger signal is issued and computes a capture value as the difference of the captured counter value logical left shifted by a first scale factor and the decoded value logical right shifted by a second scale factor.

21 Claims, 4 Drawing Sheets

(56) References Cited

U.S. PATENT DOCUMENTS

| | | |
|---|---|---|
| 2012/0319751 A1 | 12/2012 | Tessarolo et al. |
| 2013/0229214 A1* | 9/2013 | Ichida .................. G11C 7/1039 327/158 |
| 2017/0149418 A1 | 5/2017 | Tessarolo et al. |
| 2019/0074841 A1* | 3/2019 | Satoh .................. G11C 7/1066 |

* cited by examiner

HIGH RESOLUTION TIME CAPTURE CIRCUIT AND CORRESPONDING DEVICE, CAPTURE METHOD AND COMPUTER PROGRAM PRODUCT

CROSS-REFERENCE TO RELATED APPLICATIONS

This application claims priority to Italian Patent Application No. 102019000006396, filed on Apr. 26, 2019, which application is hereby incorporated herein by reference.

TECHNICAL FIELD

Embodiments of the present disclosure relate to solutions concerning high resolution time capture circuit.

The present disclosure in particular refers to techniques for performing high resolution capture of input signal in a device, e.g. an integrated circuit, in particular a microcontroller, in particular microcontrollers for automotive/industrial high-end applications.

BACKGROUND

Time capture circuits are known, which measure time between events, in particular edges, of a logic input signal. In this context, most of the applications, including some automotive applications, require a resolution in the timing control of the order of a few hundred picoseconds. This high resolution in timing control is beneficial in high accuracy digital control applications such as LED lighting, motor control and power conversion. For example, a high resolution input capture function improve the control accuracy for period/duty cycle measurements of pulses train cycles, instantaneous speed/frequency measurements, voltage measurements across an isolation boundary and distance/sonar measurement and scanning.

With regards to the input capture functions, the required resolution is generally higher than the maximum resolution allowable from the microcontroller (MCU) operating clock frequency and currently there is no known solution except increasing the operating clock frequency.

The design of a time capture circuit working with a frequency clock higher than the frequency clock of the whole device presents drawbacks in term of module die size, power consumption and noise emission/sensitivity.

SUMMARY

Embodiments of the present disclosure relate to solutions concerning high resolution time capture circuit. Particular embodiments relate to techniques for performing high resolution capture of input signal in a device, e.g., an integrated circuit such as a microcontroller for automotive/industrial high-end applications.

Embodiments of the invention can overcome one or more of the above drawbacks.

Embodiments of the present disclosure also relate to a time capture circuit to measure time between events, in particular edges, of a logic input signal. A delay line receives the input signal and generates a plurality of consecutive increasingly delayed replicas of the logic input signal. Each replica is delayed by a fixed delay with respect to the preceding replica. A free running counter is clocked by a counter clock signal corresponding to an external clock signal multiplied by a clock scale factor and supplies a counter value to a counter value capture block. The counter value capture block also receives the input signal and being configured to capture the counter value upon the occurrence of an event in the input signal outputting a captured counter value and issuing a trigger signal.

A decoder receives the input signal, the plurality of delayed replicas, the captured counter value, and the trigger signal. The decoder is configured to determine a decoded value on the basis of at least the values of the input signal and of the plurality of consecutive increasingly replicas when the trigger signal is issued and to compute a capture value as the difference of the captured counter value logical left shifted by a first scale factor and the decoded value logical right shifted by a second scale factor.

In variant embodiments, the delay line comprises a number of delay circuits equal to two raised to a power of a given integer size factor and the second scale factor is equal to the integer size factor minus the first scale factor.

In variant embodiments the circuit includes a configuration register configured to supply the first scale factor to the counter value capture module and to the decoder and to supply the clock scale factor to the counter clock.

In variant embodiments, the decoder accesses a first decoding table comprising records, in particular rows, including as fields, in particular column, the values of the external signal and of the other delayed replicas at the capture event corresponding to external signal event, and the corresponding decoded value, which value is correspondence with a capture interval in which the external signal event occurs.

In variant embodiments, the decoder is further configured to compare periodically with the frequency of a respective clock the current value of the input signal and of the plurality of consecutive increasingly replicas with the ones acquired during the previous clock period to identify value changes and in the positive, if at least one of the values is changed, to issue a feedback trigger signal to the counter value capture block to store the counter value, unless the current value of the input signal and of the plurality of consecutive increasingly replicas are all zeros or all ones.

In variant embodiments, the decoder accesses an enhanced decoder table which includes a further field indicating the result of the comparison with respect to the external signal and a further field indicating a capture length value.

In variant embodiments, the enhanced decoder table associates records corresponding to the first decoder table to a conventional value of capture length and to a positive result of the comparison for the external signal, and sets of records associated to a negative result of the comparison for the external signal and to respective different values of capture length storing in each record the values taken by the external signal and delayed replicas at the capture event occurs in one of the capture intervals.

Embodiments of the present disclosure also relate to an electronic device comprising a time capture circuit to measure time between events, for example, edges, of a logic input signal. The time capture circuit comprises a delay line receiving at its input the input signal and generating a plurality of consecutive increasingly delayed replicas of the logic input signal. Each replica delayed by a fixed delay with respect to the preceding replica. A free running counter is clocked by a counter clock signal corresponding to an external clock signal multiplied by a clock scale factor and supplies a counter value to a counter value capture block. The counter value capture block also receives the input signal and is configured to capture the counter value upon the occurrence of an event in the input signal outputting a captured counter value and issuing a trigger signal.

A decoder receives as inputs the input signal, the plurality of delayed replicas and the captured counter value and the trigger signal. The decoder is configured to determine a decoded value on the basis of at least the values of the input signal and of the plurality of consecutive increasingly replicas when the trigger signal is issued and to compute a capture value as the difference of the captured counter value logical left shifted by a first scale factor and the decoded value logical right shifted by a second scale factor.

Embodiments of the present disclosure also relate to a method for time capture to measure time between events, in particular edges, of a logic input signal. The method comprises inputting to a delay line the input signal generating a plurality of consecutive increasingly delayed replicas of the signal, each replica delayed by a fixed delay with respect to the preceding replica, operating a free running counter clocked by counter clock signal corresponding to an external clock signal multiplied by a clock scale factor and supplies a counter value to a counter value capture block capturing the counter value upon the occurrence of an event in the input signal and outputting a captured counter value and issuing a trigger signal, and determining, in particular at a decoder, determine a decoded value on the basis of the values of the input signal and the plurality of consecutive increasingly replicas when the trigger signal is issued and computing a capture value as the difference of the captured counter value logical left shifted by a first scale factor and the decoded value logical right shifted by a second scale factor.

In variant embodiment the method includes setting the clock scale factor to one.

The present disclosure relates also to a computer program product directly loadable into the internal memory of a digital computer, comprising software code portions.

BRIEF DESCRIPTION OF THE DRAWINGS

Embodiments of the present disclosure will now be described with reference to the annexed drawings, which are provided purely by way of non-limiting example and in which.

DETAILED DESCRIPTION OF ILLUSTRATIVE EMBODIMENTS

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
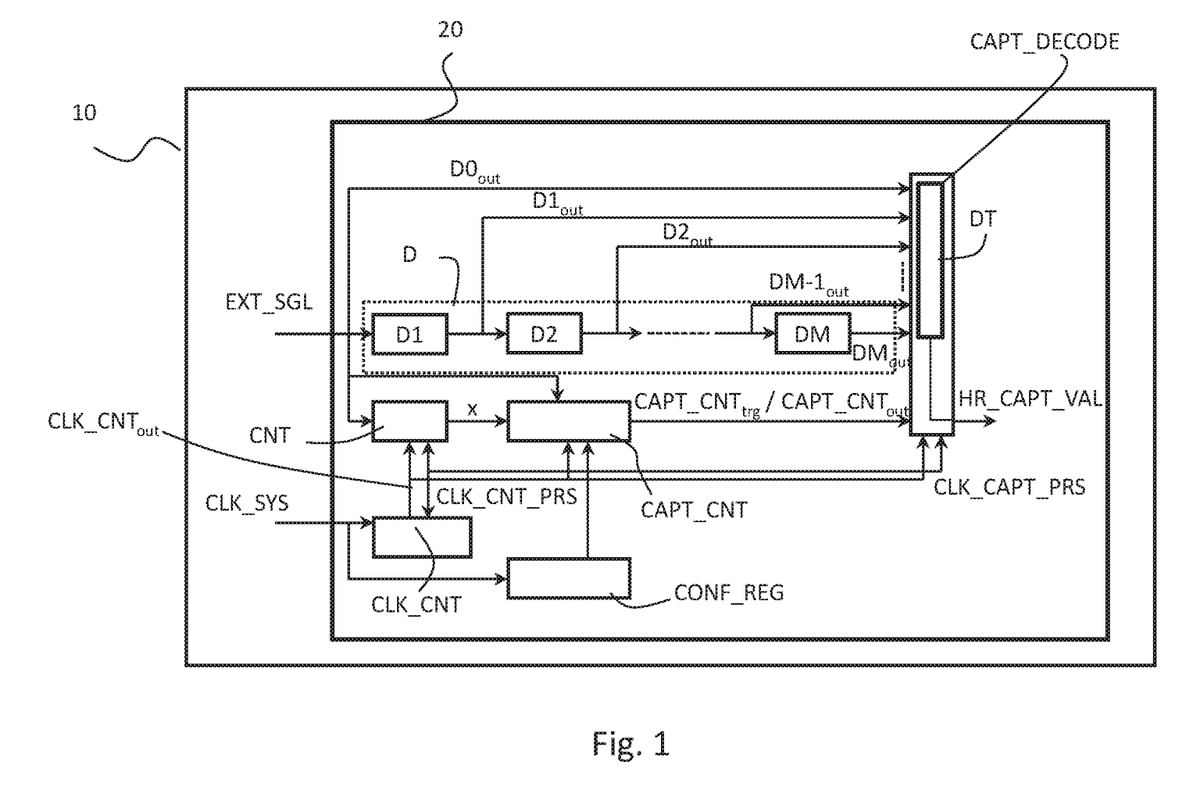
FIG. 1 is a schematic circuit diagram of an embodiment of the solution here described.

In FIG. 1 it is shown an embodiment of the solution here described.

In FIG. 1 it is thus shown a time capture circuit 20 which receives as input signal an external signal EXT_SGL corresponding to the external signal to be monitored, e.g. a PWM (Pulse Width Modulation) signal with variable period and/or variable duty cycle. The time capture circuit 20 is comprised for instance in an electronic device 10, e.g. a microcontroller or other integrated chip circuit. The time capture circuit 20 is thus clocked by a system clock signal CLK_SYS, e.g. the clock of the whole device on which the circuit 20 operates. The external signal EXT_SGL can be a signal generated by the device 10 or fed to device 10 from another device.

The external signal EXT_SGL enters a delay line D, which includes a sequence of delay blocks introducing a same fixed delay, D1, ..., Dm, ..., DM with m consecutive integer index varying between 1 and a number M. The number M, i.e. the number of delay circuits blocks in the delay line D, is equal to two raise to power of a given integer size factor N, i.e. M=2N-1. The sequence of delay blocks introducing a same fixed delay D1, ..., Dm, ..., DM determine a corresponding plurality consecutive increasingly delayed replicas of the input signal, D1out, ..., Dm out, ..., DMout, each m-th replica delayed by a fixed delay TDm with respect to the preceding (m-1)-th replica. The delay time length TDm is:

$$TD1=TD2= \ldots =TDM=1/((M+1)*fCLK\_SYS)= 1/((2N)*fCLK\_SYS) \quad (1)$$

where fCLK_SYS is the frequency of the system clock signal CLK_SYS.

The external signal EXT_SGL is internally routed to sub-modules CNT, CAPT_CNT, where sub-module CNT is a counter and a CAPT_CNT a capture module able to capture the counter value of counter CNT on events occurring in the external signal EXT_SGL.

The counter CNT is clocked by clock counter module CLK_CNT with a respective clock counter signal CLK_CNT_out which corresponds to the ratio of the system clock CLK_SYS to a value CLK_CNT_PRS selected by a configuration register CONF_REG. Such configuration register CONF_REG can a register of the electronic device 10 or set by the electronic device 10.

More in detail, the counter CNT is a free-running counter. The counter capture module CAPT_CNT, which also receives the external signal EXT_SGL, is configured to capture, e.g., store, a counter value x of the counter CNT on a event of the external signal EXT_SGL, e.g., on a rising edge, on a falling edge or both, and issues a corresponding trigger signal CAPT_CNTtrg to a capture decode module CAPT_DECODE. The counter capture module CAPT_CNT in the same time also sends a captured value CAPT_CNTout, which corresponds to the captured counter value x to the capture decode module CAPT_DECODE. The capture feature of the counter capture module CAPT_CNT is configurable by the configuration register CONF_REG. The counter CNT is clocked by the clock counter module CLK_CNT generating a clock CLK_CNToutput with a frequency equal or lower than the frequency of the system clock, i.e. CLK_CNToutput=CLK_SYS/CLK_CNT_PRS where CLK_CNT_PRS=2q with q=0, 1, . . . , Q, which is a positive integer clock pre-scaler parameter selected by the configuration register CONF_REG.

If it is CLK_CNTout=CLK_SYS, (i.e., the clock pre-scaler parameter CLK_CNT_PRS=1), thus the counter CNT is clocked at the same clock frequency of the system, CLK_SYS, the high-resolution capture feature of the circuit 20 can be activated by selecting in the configuration register CONF_REG the value of a first scale parameter, CKL_CAPT_PRS, supplied to the capture decode module CAPT_DECODE, greater than zero. The first scale parameter CKL_CAPT_PRS can assume the value 0, 1, . . . , N, N being the given integer size factor which sets the size of the delay line D. A capture resolution of the module HR_CAPT is:

$$HR\_CAPT\_RES = CLK\_SYS\_RES/2CKL\_CAPT\_PRS = 1/(2CKL\_CAPT\_PRS*fCLK\_SYS) \quad (2)$$

CLK_SYS_RES is the clock system resolution, i.e. the time between two consecutive edges of the system clock signal CLK_SYS.

It is underlined that in general the time capture circuit 20 can operate also if CLK_CNT_PRS>1, however to operate the circuit 20 with an input clock frequency lower than the system clock could produce a reduction of the power consumption, e.g. the circuit could be used to have the same resolution of the system clock but with a lower input clock. In this case the resolution CLK_SYS_RES can be replaced in the formulas with CLK_CNT_RES=CLK_SYS_RES*CLK_CNT_PRS.

If the first scale parameter CKL_CAPT_PRS is equal to the integer size factor N, the capture decode module CAPT_DECODE on a new capture event (i.e. the trigger CAPT_CNTtrg signal coming from the counter capture module CAPT_CNT) reads the output value CAPT_CNTout of the counter capture module CAPT_CNT and outputs values of signals D0out, D1out, . . . , DMout of the external signal EXT_SGL=D0 and of the delay blocks D1, . . . , DM and it calculates a high resolution capture value HR_CAPT_VAL as:

$$HR\_CAPT\_VAL = (CAPT\_CNTout << CKL\_CAPT\_PRS) - (CAPT\_DCD) \quad (3)$$

The clock interval of the system clock CLK_SYS, which correspond to the counter clock CNT_CLK, can be thus seen as divided in 2CKL_CAPT_PRS capture intervals, Im, m=0 . . . 2CKL_CAPT_PRS-1. If CKL_CAPT_PRS is equal to the integer size factor N, m=0 . . . M. The capture interval of index 0 is the nearest in time to a capture event C, corresponding to the issuance of the trigger CAPT_CNT_trg by the counter capture module CAPT_CNT.

CAPT_DCD indicates a decoded value calculated, in particular obtained, by the decode module CAPT_DECODE by a decoded table DT, exemplified here below in Table 1, assuming that the time length of the EXT_SGL level (high or low logic level) is greater than the decoded value CAPT_DCD.

If first scale parameter CKL_CAPT_PRS is lower than the integer size factor N, the decoder CAPT_DECODE calculates the capture value HR_CAPT_VAL with a more general expression as:

$$HR\_CAPT\_VAL = (CAPT\_CNTout << CKL\_CAPT\_PRS) - (CAPT\_DCD >> (N-CKL\_CAPT\_PRS)) \quad (4)$$

In other words the capture value HR_CAPT_VAL is the difference of the captured counter value CAPT_CNTout logical left shifted by a first scale factor CKL_CAPT_PRS, i.e. multiplied, and the decoded value CAPT_DCD logical right shifted by a second scale factor.

Here below it is shown Table 1, representing the decoding table DT used by the decoder CAPT_DECODE to obtain the decoded value CAPT_DCD. Such table is a data structure including a number of records, in the example the table rows, which include in a field, i.e. a column, the decoded value CAPT_DCD, and in the following fields, specifically columns, the values of the external signal, indicated as zero delayed replica D0out and of the other M-1 delayed replicas D1out . . . DMout at the issuance of the trigger signal CAPT_CNTtrg, following an event E (E1, E2, in FIG. 2) i.e. at the capture event C (C1, C2 in FIG. 2).

The external signal value D0out can be logical zero or logical one, depending on the event E of the external signal EXT_SGL issuing the trigger signal CAPT_CNTtrg. The value in the decoding table DT corresponding to the delayed replicas D1out . . . DMout are indicated as D0, i.e. they have the same level of D0out, or $\overline{D0}$, they have the negated logic level. Given a set of this ordered values of D0out . . . DMout from the Table 1, which is for instance a look-up table stored in the decoder CAPT_DECODE, the corresponding decoded value CAPT_DCD is obtained.

TABLE 1

| CAPT_DCD | D0out | D1out | D2out | Dmout | DM-1out | DMout |
|---|---|---|---|---|---|---|
| 0 | 0/1 | $\overline{D0}$ | $\overline{D0}$ | . . . | $\overline{D0}$ | $\overline{D0}$ |
| 1 | 0/1 | D0 | $\overline{D0}$ | . . . | $\overline{D0}$ | $\overline{D0}$ |
| 2 | 0/1 | D0 | D0 | . . . | $\overline{D0}$ | $\overline{D0}$ |
| . . . | . . . | . . . | . . . | . . . | . . . | . . . |
| M-1 | 0/1 | D0 | D0 | . . . | D0 | $\overline{D0}$ |
| M | 0/1 | D0 | D0 | . . . | D0 | D0 |

The decoder table DT is built by using the values of the external signal, indicated as zero delayed replica D0out and of the other M-1 delayed replicas D1out . . . DMout as access input value to obtain the decoded value CAPT_DCD. The decoder table DT is in particular built by storing in each row the values taken by the external signal Dout and delayed replicas D0out . . . DMout at the capture event C, e.g. C1, corresponding to the occurrence of an event, e.g. rising edge E1 in one of the capture intervals Im. If Im=I0, i.e. the rising edge E1 happens just before the capture event C1, CAPT_DCD is correspondingly 0, if Im=IM, CAPT_DCD=M.

In other words, the circuit 20 includes a decoder CAPT_DECODE accessing a first decoding table DT comprising records, in particular rows, including as fields, in particular columns, the values of the external signal D0out and of the other delayed replicas D1out . . . DMout at the capture event C corresponding to external signal event E, and the corresponding decoded value CAPT_DCD, which value is in correspondence with a capture interval in which the external signal event E occurs. It is underlined that such correspondence can be different if the capture interval is indexed differently with respect to the decoded value CAPT_DCD, e.g. from the farthest interval (I0) from capture C to the nearest (IM) instead of from the nearest (I0) to the farthest.

Considering a first example, for N=2, M=2N−1=3 and TD1=TD2=TD3=1/(4*fCLK_SYS) according to the formula (1), CKL_CAPT_PRS=2, HR_CAPT_RES=CLK_SYS_RES/4 according to the formula (2).

The values of the decoder table DT for this example are shown in Table 2 here below.

TABLE 2

| CAPT_DCD | D0out | D1out | D2out | D3out |
|---|---|---|---|---|
| 0 | 0/1 | $\overline{D0}$ | $\overline{D0}$ | $\overline{D0}$ |
| 1 | 0/1 | D0 | $\overline{D0}$ | $\overline{D0}$ |
| 2 | 0/1 | D0 | D0 | $\overline{D0}$ |
| 3 | 0/1 | D0 | D0 | D0 |

Figure 2:
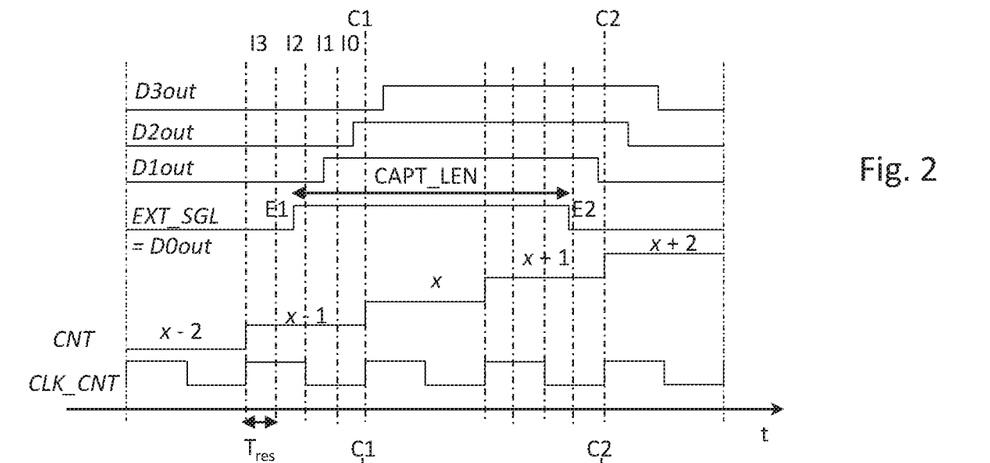
FIGS. 2 and 3 are time diagrams of signals formed in the embodiment of FIG. 1 in different operating conditions.

In FIG. 2 it is shown a time diagram referred to such example, in which, as a function of time t are indicated the signals D0 or EXT_SGL, D1, D2, D3, the counter value CNT and the counter clock CLK_CNT. C1 indicates a first capture event, C2 indicates a second capture event. As it can be seen the external signal EXT_SGL presents a first rising edge, e.g. a first event, E1, and at the next clock period of the counter clock CLK_CNT the first capture event C1 happens, i.e. the counter capture module CAPT_CNT, which also receives the external signal EXT_SGL, stores the counter value x of the counter CNT on the event E1, i.e. the rising edge, and issues the corresponding trigger signal CAPT_CNTtrg to the capture decode module CAPT_DECODE. Therefore the capture event C1 signals the moment the signals D0out, D1out, D2out, D3out are evaluated to access the decoder table DT and obtain the decoded value CAPT_DCD.

FIG. 2 also shows the capture intervals Im in which the period T of the counter clock CNT_CLK is subdivided for capture according to the resulting sampling resolution Tres, i.e. the time amplitude of the intervals Im, which having set the first scale parameter CKL_CAPT_PRS by the configuration register CONF_REG equal to 2, e.g. equal to N, imposes HR_CAPT_RES=CLK_SYS_RES/4 thus the sampling resolution time Tres is ¼ of the clock period, CNT_CLK, i.e. by choosing the first scale parameter equal to the size parameter the minimum sampling resolution time is obtained. The intervals are thus I0 . . . I3, starting from the nearest to capture event C.

Referring to FIG. 2 and to Table 2, on the first capture event C1, the decoded value CAPT_DCD is equal to 2 (D0=1, D1=1=D0, D2=1=D0, D3=0≠D0) and HR_CAPT_VAL=(x<<2)−(2>>0) according to the formula (3), while on the second capture event C2, falling edge of EXT-SGL, CAPT_DCD=1 (D0=0, D1=0=D1, D2=1≠D0, D3=1≠D0) and HR_CAPT_VAL=((x+2)<<2)−(1>>0) according to the formula (3).

Figure 3:
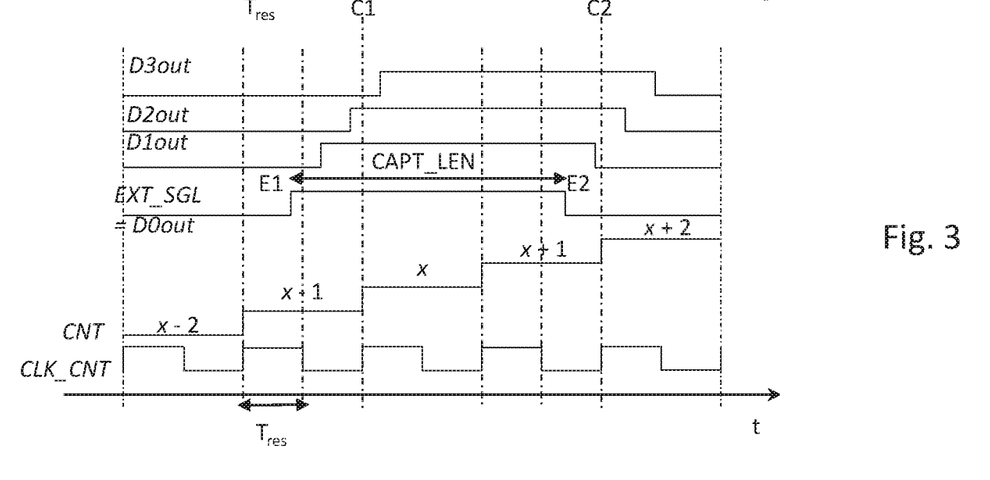

Considering a second example, for N=2, M=2N−1=3 and TD1=TD2=TD3=1/(4*fCLK_SYS) according to the formula (1), if CKL_CAPT_PRS=1 i.e. lower than the size parameter N, HR_CAPT_RES=CLK_SYS_RES/2 according to the formula (2). Referring to the FIG. 3, which shows a time diagram for the second example analogous to the one of FIG. 2, and to Table 2, on the first capture event C1 CAPT_DCD=2 (D0=1, D1=1=D0, D2=1=D0, D3=0≠D0)

and HR_CAPT_VAL=(x<<1)−(2>>1)=(x<<1)−1 according to the formula (4), while on the second capture event C2 CAPT_DCD=1 (D0=0, D1=0=D0, D2=1≠D0, D3=1≠D0) and HR_CAPT_VAL=((x+2)<<1)−(1>>1)=((x+2)<<1)−0 according to the formula (4).

FIG. 3 shows the sampling resolution Tres, which having set the first scale parameter CKL_CAPT_PRS by the configuration register CONF_REG equal to 1, e.g., lower than N, imposes HR_CAPT_RES=CLK_SYS_RES/2 thus the sampling resolution time Tres is greater than the minimum sampling resolution time, i.e. ½ of the clock period, CNT_CLK.

In further embodiments, the constraint on the minimum time length of the EXT_SGL level can be removed.

Figure 5:
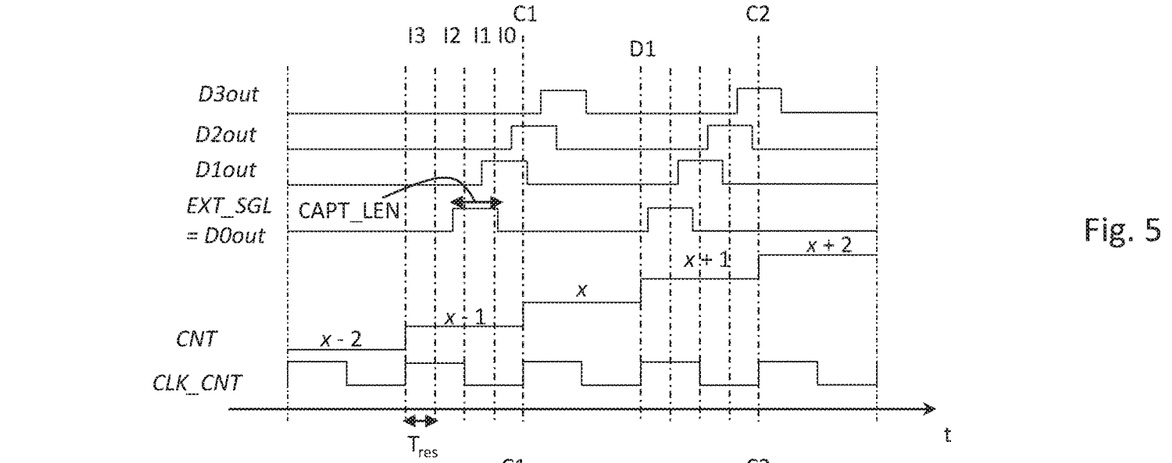
FIGS. 5 and 6 are time diagrams of signals formed in the embodiment of FIG. 4 in different operating conditions.

In FIG. 5 it is thus shown a further embodiment of the solution here described, which includes a time capture circuit 20', which removes the constraint on the minimum time length of the EXT_SGL level. The architecture of the circuit 20' corresponds substantially to the one of circuit 20', the main difference being that the decoder CAPT_DECODE is configured to compare periodically (i.e. with the frequency of its clock, which is the counter clock CLK_CNT, as shown in FIGS. 1 and 5 the current output values D0out, D1out, . . . , DMout of the external signal EXT_SGL=D0 and of the delay blocks D1, . . . , DM with the ones present at the previous period of the counter clock CLK_CNT, and, if at least one of the values is changed (i.e. a new event is occurred) the decoder CAPT_DECODE sends a feedback trigger signal CAPT_DECODEtrg to the capture counter module CAPT_CNT commanding to store the counter value CNT. If the current output values D0out, D1out, . . . , DMout are all zeros or all ones (in the latter e.g. signal level normally high with CAPT_LEN referred to duration of low level), even if there is one or more changes, the event is discarded (e.g. event D1 in FIG. 5).

On each not-discarded event, the sub-module CAPT_DECODE calculates the capture value HR_CAPT_VAL using the formula (4) and a length HR_CAPT_LEN, i.e. the time length of the level of the external signal EXT_SGL, i.e. the time between the two edges E1, E2, as:

HR_CAPT_LEN=CAPT_LEN   (5)

In this embodiment, the decoder CAPT_DECODE calculates the decode value CAPT_DCD and the capture length CAPT_LEN value by an enhanced table EDT an embodiment of which is represented in Table 3 shown here below.

Such Table 3, similarly to Table 1, has records, in particular organized in rows, and in the first field, i.e. column has the decoded value CAPT_DCD, and in the following columns the values of the external signal, indicated as zero delayed replica D0out, and of the other M−1 delayed replicas D1out . . . DMout. However includes two further fields, i.e. columns, a column for the capture length CAPT_LEN value, which is obtained together with the decoded value CAPT_DCD, and a column indicating if the criterion D0out≠D0PRE, is satisfied, in particular by indicating yes Y or no N.

TABLE 3

| CAPT_DCD | CAPT_LEN | D0out ≠ D0$_{PRE}$ [N = NO, Y = YES] | D0out | D1out | D2out | Dmout | DM-1out | DMout |
|---|---|---|---|---|---|---|---|---|
| 0 | 0 | Y | 0/1 | $\overline{D0}$ | $\overline{D0}$ | ... | $\overline{D0}$ | $\overline{D0}$ |
| 1 | 0 | Y | 0/1 | D0 | $\overline{D0}$ | ... | $\overline{D0}$ | $\overline{D0}$ |
| 2 | 0 | Y | 0/1 | D0 | D0 | ... | $\overline{D0}$ | $\overline{D0}$ |
| ... | 0 | Y | ... | ... | ... | ... | ... | ... |
| M-1 | 0 | Y | 0/1 | D0 | D0 | ... | D0 | $\overline{D0}$ |
| M | 0 | Y | 0/1 | D0 | D0 | ... | D0 | D0 |
| 1 | 1 | N | 0/1 | $\overline{D0}$ | D0 | ... | D0 | D0 |
| 2 | 1 | N | 0/1 | D0 | $\overline{D0}$ | ... | D0 | D0 |
| ... | ... | ... | ... | ... | ... | ... | ... | ... |
| M-1 | 1 | N | 0/1 | D0 | D0 | ... | $\overline{D0}$ | D0 |
| M | 1 | N | 0/1 | D0 | D0 | ... | D0 | $\overline{D0}$ |
| 2 | 2 | N | 0/1 | $\overline{D0}$ | $\overline{D0}$ | ... | D0 | D0 |
| ... | ... | ... | ... | ... | ... | ... | ... | ... |
| M-1 | 2 | N | 0/1 | D0 | D0 | ... | $\overline{D0}$ | D0 |
| M | 2 | N | 0/1 | D0 | D0 | ... | $\overline{D0}$ | $\overline{D0}$ |
| ... | ... | ... | ... | ... | ... | ... | ... | ... |
| M-1 | M-1 | N | 0/1 | $\overline{D0}$ | $\overline{D0}$ | ... | $\overline{D0}$ | D0 |
| M | M-1 | N | 0/1 | D0 | $\overline{D0}$ | ... | $\overline{D0}$ | $\overline{D0}$ |
| M | M | N | 0/1 | $\overline{D0}$ | $\overline{D0}$ | ... | $\overline{D0}$ | $\overline{D0}$ |

If the D0≠D0PRE where D0 is the current value of the external signal EXT_SGL and D0PRE is the previous value, the time length of the input signal is greater than the decoded CAPT_DCD value and the length CAPT_LEN value must not be calculated. In this case the capture length CAPT_LEN assumes a conventional value, e.g. zero.

In other word, the duration of the current (i.e. new) value of the external signal EXT_SGL is detected also by the counter capture module CAPT_CNT satisfying the constraint on the minimum time length of the external signal EXT_SGL level. As result, this general case falls into the previous case and the Table 3 is reduced to the Table 1.

The enhanced table EDT is built by providing the same decode table DT if D0out≠D0PRE, while if D0out=D0PRE, for each value of CAPT_LEN is added a corresponding table of values, by storing in each row the values taken by the external signal D0out and delayed replicas D1out ... DMout at the capture event C, e.g. C1, corresponding to the occurrence of an event, e.g. rising edge E1 in one of the capture intervals Im and by considering that CAPT_LEN can be less or equal to CAPT_DCD otherwise D0out≠D0PRE The tables have a decreasing number of rows increasing the value of CAPT_LEN, since for each value of CAPT_LEN, the minimum value of CAPT_DCD cannot be less than the value of CAPT_LEN in order to not satisfy the criterion D0out≠D0PRE.

In other words, the circuit 20 includes an enhanced decoder table EDT which associates records, i.e. rows, corresponding to the first decoder table DT to a conventional value of capture length CAP_LEN, in particular zero, and to a positive result of the comparison for the external signal D0 (D0out≠D0PRE), while sets of records are associated to a negative result (D0out≠D0PRE) and to respective different values of capture length CAP_LEN storing in each record the values taken by the external signal D0out and delayed replicas D1out ... DMout at the capture event C when the event E occurs in one of the capture intervals Im.

Considering a practical example, for N=2, M=2N−1=3 and TD1=TD2=TD3=1/(4*fCLK_SYS) according to the formula (1). If CKL_CAPT_PRS is set equal to 2, i.e. equal to N, HR_CAPT_RES=CLK_SYS_RES/4 according to the formula (2).

In FIG. 5 it is shown a time diagram similar to those of FIGS. 2 and 3 referred to such example, in which therefore the capture length CAPT_LEN between edges E1, E2 is shorter than the minimum length, i.e. the decoded value CAPT_DCD.

The values of the decoder table for this example are shown in Table 4 here below.

TABLE 4

| CAPT_DCD | CAPT_LEN | D0 ≠ D0$_{PRE}$ [N = NO, Y = YES] | D0out | D1out | D2out | D3out |
|---|---|---|---|---|---|---|
| 0 | 0 | Y | 0/1 | $\overline{D0}$ | $\overline{D0}$ | $\overline{D0}$ |
| 1 | 0 | Y | 0/1 | D0 | $\overline{D0}$ | $\overline{D0}$ |
| 2 | 0 | Y | 0/1 | D0 | D0 | $\overline{D0}$ |
| 3 | 0 | Y | 0/1 | D0 | D0 | D0 |
| 1 | 1 | N | 0/1 | $\overline{D0}$ | D0 | D0 |
| 2 | 1 | N | 0/1 | D0 | $\overline{D0}$ | D0 |
| 3 | 1 | N | 0/1 | D0 | D0 | $\overline{D0}$ |
| 2 | 2 | N | 0/1 | $\overline{D0}$ | $\overline{D0}$ | D0 |
| 3 | 2 | N | 0/1 | D0 | $\overline{D0}$ | $\overline{D0}$ |
| 3 | 3 | N | 0/1 | $\overline{D0}$ | $\overline{D0}$ | $\overline{D0}$ |

Referring to the FIG. 5 and to the Table 4, on the first capture event C1, CAPT_DCD=2 (D0=0, D1=1≠D0, D2=1≠D0, D3=0≠D0), HR_CAPT_VAL=(x<<2)−(2>>0) according to the formula (3) and HR_CAPT_LEN=CAPT_LEN=2, while on the second capture event C2 CAPT_DCD=3 (D0=0, D1=0=D0, D2=0≠D0, D3=1≠D0) and HR_CAPT_VAL=((x+2)<<2)−(3>>>0) according to the formula (3) and HR_CAPT_LEN=CAPT_LEN=1.

Figure 6:
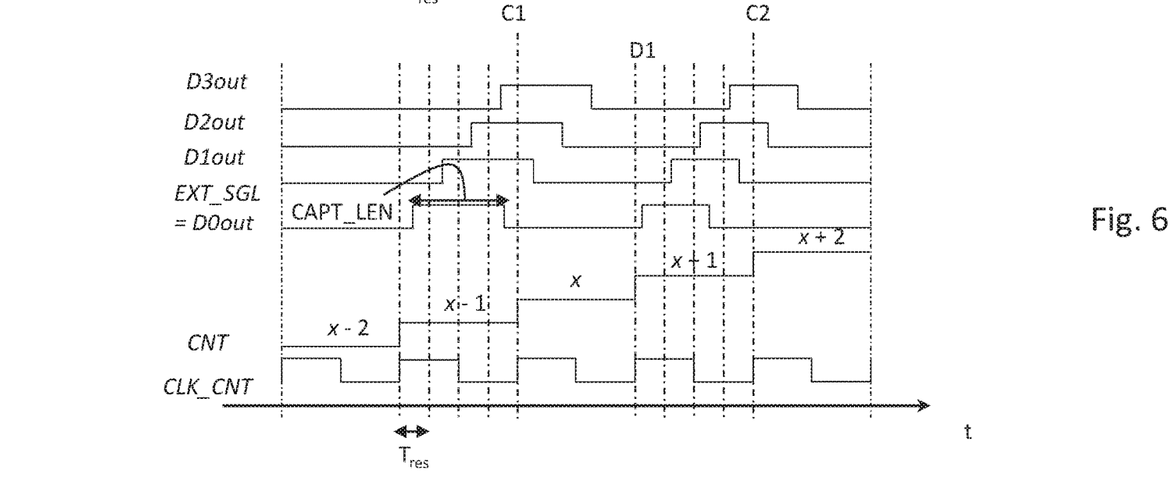

FIG. 6 represents instead a time diagram in the case of a different longer capture length CAPT_LEN between edges E1, E2, always shorter than the minimum length.

Referring to the FIG. 6 and to the Table 4, on the first capture event CAPT_DCD=3 (D0=0, D1=1≠D0, D2=1≠D0, D3=1≠D0), HR_CAPT_VAL=(x<<2)−(3>>0) according to the formula (3) and HR_CAPT_LEN=CAPT_LEN=3, while on the second capture event CAPT_DCD=3 (D0=0, D1=0=D0, D2=1≠D0, D3=1≠D0) and HR_CAPT_VAL=((x+2)<<2)−(3>>>0) according to the formula (3) and HR_CAPT_LEN=CAPT_LEN=2.

Figure 4:
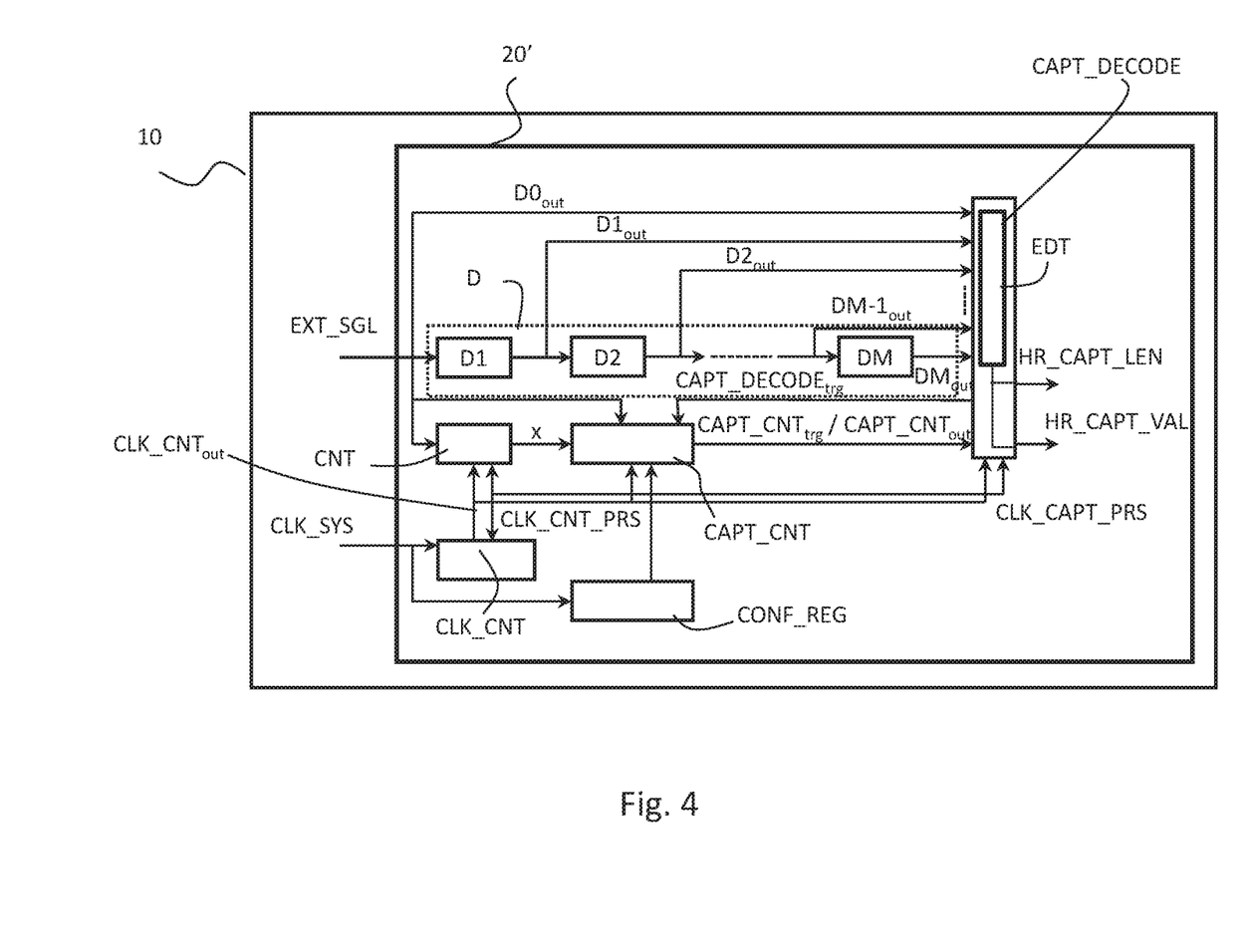
FIG. 4 is a schematic circuit diagram of a further embodiment of the solution here described.

Thus, in the circuit 20' of FIG. 4 the decoder CAPT_DECODE accesses an enhanced decoded table EDT to obtain a capture value and a capture length value.

An embodiment of the circuit 20/20' can operate with a maximum external clock frequency, CLK_SYSMAX=400 MHz. The minimum required resolution can be loops, which determines that the minimum value of number M of delay circuits blocks in the delay line D is MMIN=1/(200 ps*400 MHz)−1=12.5. Thus by selecting the size parameter N as 4, M=15, TDm=1/(16*CLK_SYSMAX)=156.25 ps.

The solutions disclosed herein have thus significant advantages with respect to the known solutions.

The solutions just described improve the capture feature resolution without increasing the operating clock frequency of the electronic device hosting the capture circuit, e.g. the microcontroller, avoiding the drawbacks in term of power consumption and noise emission/sensitivity.

Of course, without prejudice to the principle of the invention, the details of construction and the embodiments may vary widely with respect to what has been described and illustrated herein purely by way of example, without thereby departing from the scope of the present invention, as defined by the ensuing claims.

What is claimed is:

1. A time capture circuit to measure time between events of a logic input signal, the time capture circuit comprising:
    a delay line configured to receive the logic input signal and to generate a plurality of consecutive increasingly delayed replicas of the logic input signal, each replica delayed by a fixed delay with respect to a preceding replica;
    a free running counter that is clocked by a counter clock signal corresponding to an external clock signal multiplied by a clock scale factor;
    a counter value capture circuit coupled to receive a counter value from the free running counter and to also receive the logic input signal, the counter value capture circuit configured to capture the counter value upon occurrence of an event in the logic input signal outputting a captured counter value and to issue a trigger signal; and
    a decoder coupled to the logic input signal, the plurality of consecutive increasingly delayed replicas, the captured counter value and the trigger signal, the decoder being configured to determine a decoded value based on values of the logic input signal and of the plurality of consecutive increasingly delayed replicas when the trigger signal is issued and to compute a capture value as the difference of the captured counter value logical left shifted by a first scale factor and the decoded value logical right shifted by a second scale factor.

2. The time capture circuit according to claim 1, wherein the events comprise edges of the logic input signal.

3. The time capture circuit according to claim 1, wherein the delay line comprises a number M of delay circuits, wherein M=2$^N$, N being a given integer size factor, and wherein the second scale factor is equal to the integer size factor N minus the first scale factor.

4. The time capture circuit according to claim 1, further comprising a configuration register configured to supply the first scale factor to the counter value capture circuit and to the decoder and to supply the clock scale factor to the free running counter.

5. The time capture circuit according to claim 1, wherein the decoder is configured to access a first decoding table comprising records that include, as fields, the values of an external signal and of other consecutive increasingly delayed replicas at a capture event corresponding to an external signal event, and the corresponding decoded value, which value corresponds with a capture interval in which the external signal event occurs.

6. The time capture circuit according to claim 5, wherein the records are arranged in rows and the fields are arranged in columns.

7. The time capture circuit according to claim 1, wherein the decoder is further configured to compare, periodically with a frequency of the counter clock signal, a current value of the logic input signal and a current value of each of the plurality of consecutive increasingly delayed replicas at a current clock period with a previous value of the logic input signal and a previous value of each of the plurality of consecutive increasingly delayed replicas at a previous clock period to identify value changes.

8. The time capture circuit according to claim 7 wherein the decoder is configured to issue a feedback trigger signal to the counter value capture circuit to store the counter value in response to a change in value of at least one of the logic input signal or one of the plurality of consecutive increasingly delayed replicas, unless a current value of the logic input signal and a current value of each of the plurality of consecutive increasingly delayed replicas at a current clock period are all zeros or all ones.

9. The time capture circuit according to claim 8, wherein the decoder is configured to access a first decoding table comprising records that include, as fields, the values of an external signal and of other consecutive increasingly delayed replicas at a capture event corresponding to an external signal event, and the corresponding decoded value, which value corresponds with a capture interval in which the external signal event occurs.

10. The time capture circuit according to claim 9, wherein the decoder is configured to access an enhanced decoder table that includes a further field indicating the result of the comparison with respect to the external signal and a further field indicating a capture length value.

11. The time capture circuit according to claim 10, wherein the enhanced decoder table associates records corresponding to the first decoder table to a conventional value of capture length and to a positive result of the comparison for the external signal, and sets of records associated to a negative result of the comparison for the external signal and to respective different values of capture length storing in each record the values taken by the external signal and delayed replicas at the capture event when the event occurs in one of the capture intervals.

12. A method for time capture to measure time between event edges of a logic input signal, the method comprising:
    inputting, to a delay line, the logic input signal to generate a plurality of consecutive increasingly delayed replicas of the logic input signal, each replica delayed by a fixed delay with respect to a preceding replica;
    operating a free running counter clocked by counter clock signal corresponding to an external clock signal multiplied by a clock scale factor and an supplying a counter value to a counter value capture circuit capturing the counter value upon an occurrence of an event in the logic input signal and outputting a captured counter value and issuing a trigger signal; and
    determining, by a decoder, a decoded value based on the values of the logic input signal and the plurality of consecutive increasingly delayed replicas when the trigger signal is issued and computing a capture value as the difference of the captured counter value logical left shifted by a first scale factor and the decoded value logical right shifted by a second scale factor.

13. A method for time capture to measure time between edges of a logic input signal, the method comprising:
receiving the logic input signal;
generating a plurality of consecutive increasingly delayed replicas of the logic input signal, each replica delayed by a fixed delay with respect to a preceding replica;
operating a free running counter clocked by a counter clock signal corresponding to an external clock signal multiplied by a clock scale factor;
upon occurrence of an edge in the logic input signal, capturing a counter value of the free running counter and issuing a trigger signal;
determining a decoded value based on the values of the logic input signal and the plurality of consecutive increasingly delayed replicas when the trigger signal is issued; and
computing a capture value as the difference of the captured counter value logical left shifted by a first scale factor and the decoded value logical right shifted by a second scale factor.

14. The method according to claim 13, further comprising setting the clock scale factor to one.

15. The method according to claim 13, wherein generating the plurality of consecutive increasingly delayed replicas comprises generating a number M of replicas, wherein $M=2^N$, N being a given integer size factor, and wherein the second scale factor is equal to the integer size factor N minus the first scale factor.

16. The method according to claim 13, wherein determining the decoded value comprises accessing a first decoding table comprising records that include, as fields, the values of an external signal and of other consecutive increasingly delayed replicas at a capture event corresponding to an external signal event, and the corresponding decoded value, which value corresponds with a capture interval in which the external signal event occurs.

17. The method according to claim 13, further comprising comparing, periodically with a frequency of the counter clock signal, a current value of the logic input signal and a current value of each of the plurality of consecutive increasingly delayed replicas at a current clock period with a previous value of the logic input signal and a previous value of each of the plurality of consecutive increasingly delayed replicas at a previous clock period to identify value changes.

18. The method according to claim 17, further comprising, issuing a feedback trigger signal in response to a change in value of at least one of the logic input signal or one of the plurality of consecutive increasingly delayed replicas, and in response to the feedback trigger signal, storing the counter value, unless a current value of the logic input signal and a current value of each of the plurality of consecutive increasingly replicas at a current clock period are all zeros or all ones.

19. The method according to claim 18, wherein determining the decoded value comprises accessing a first decoding table comprising records that include, as fields, the values of an external signal and of other consecutive increasingly delayed replicas at a capture event corresponding to an external signal event, and the corresponding decoded value, which value corresponds with a capture interval in which the external signal event occurs.

20. The method according to claim 19, further comprising accessing an enhanced decoder table that includes a further field indicating the result of the comparison with respect to an external signal and a further field indicating a capture length value.

21. A system comprising:
a processor; and
a memory coupled to the processor, the memory storing software code code that, when executed by the processor, causes the processor to perform the method of claim 13.

* * * * *